(12) United States Patent
Mizushima et al.

(10) Patent No.: US 6,525,338 B2
(45) Date of Patent: Feb. 25, 2003

(54) SEMICONDUCTOR SUBSTRATE, FIELD EFFECT TRANSISTOR, METHOD OF FORMING SIGE LAYER AND METHOD OF FORMING STRAINED SI LAYER USING SAME, AND METHOD OF MANUFACTURING FIELD EFFECT TRANSISTOR

(75) Inventors: Kazuki Mizushima, Saitama (JP); Ichiro Shiono, Saitama (JP); Kenji Yamaguchi, Saitama (JP)

(73) Assignees: Mitsubishi Materials Corporation, Tokyo (JP); Mitsubishi Materials Silicon Corporation, Tokyo (JP)

( * ) Notice: Subject to any disclaimer, the term of this patent is extended or adjusted under 35 U.S.C. 154(b) by 0 days.

(21) Appl. No.: 09/917,923

(22) Filed: Jul. 31, 2001

(65) Prior Publication Data

US 2002/0017642 A1 Feb. 14, 2002

(30) Foreign Application Priority Data

Aug. 1, 2000 (JP) .......................................... 2000-233640
May 31, 2001 (JP) .......................................... 2001-165695

(51) Int. Cl.$^7$ ....................... H01L 29/06; H01L 31/0328
(52) U.S. Cl. ............................. 257/19; 257/18; 257/15; 257/190; 257/191; 257/192
(58) Field of Search .............................. 257/18, 15, 19, 257/190, 191, 192, 194

(56) References Cited

U.S. PATENT DOCUMENTS

| 5,221,413 A | 6/1993 | Brasen et al. |
| 5,442,205 A | 8/1995 | Brasen et al. |

FOREIGN PATENT DOCUMENTS

| JP | 6-252046 | | 9/1994 |
| JP | 09-82944 | * | 3/1997 |
| WO | WO 98/00857 | | 1/1998 |

* cited by examiner

*Primary Examiner*—Minh Loan Tran
*Assistant Examiner*—Tan Tran
(74) *Attorney, Agent, or Firm*—Oblon, Spivak, McClelland, Maier & Neustadt, P.C.

(57) ABSTRACT

A semiconductor substrate, a field effect transistor, a method of forming a SiGe layer and a method of forming a strained Si layer using the same, and a method of manufacturing a field effect transistor are provided, which enable the threading dislocation density of the SiGe layer to be reduced and the surface roughness to be minimized. On top of a Si substrate 1 is provided a SiGe buffer layer 2, 12 constructed of a plurality of laminated layers comprising alternating layers of a SiGe gradient composition layer 2a, 12a in which the Ge composition ratio increases gradually from the Ge composition ratio of the base material, and a SiGe constant composition layer 2b, 12b which is provided on top of the gradient composition layer and in which the Ge composition ratio is equal to that of the upper surface of the gradient composition layer.

15 Claims, 7 Drawing Sheets

SEMICONDUCTOR SUBSTRATE, FIELD EFFECT TRANSISTOR, METHOD OF FORMING SIGE LAYER AND METHOD OF FORMING STRAINED SI LAYER USING SAME, AND METHOD OF MANUFACTURING FIELD EFFECT TRANSISTOR

BACKGROUND OF THE INVENTION

1. Field of the Invention

The present invention relates to: a semiconductor substrate, which can be used for a high speed MOSFET or the like; a field effect transistor; a method of forming a SiGe layer suitable for the formation of a strained Si layer or the like and a method of forming a strained Si layer using the same; and a method of manufacturing a field effect transistor.

2. Description of Related Art

In recent years, high speed MOSFET, MODFET and HEMT devices have been proposed in which a strained Si layer, which has been grown epitaxially on a Si (silicon) wafer with a SiGe (silicon germanium) layer disposed therebetween, is used for the channel area. In this type of strained Si-FET, a biaxial tensile strain occurs in the Si layer due to the SiGe which has a larger lattice constant than Si, and as a result, the Si band structure alters, the degeneracy is lifted, and the carrier mobility increases. Consequently, using this strained Si layer for a channel area typically enables a 1.5 to 8 fold speed increase. Furthermore in terms of processes, a typical Si substrate produced by CZ methods can be used as the substrate, and a high speed CMOS can be realized using conventional CMOS processes.

However, in order to achieve epitaxial growth of the aforementioned strained Si layer for use as the FET channel area, a good quality SiGe layer must first be grown by epitaxial growth on the Si substrate. Unfortunately, the difference between the lattice constants for Si and SiGe results in crystallinity problems due to dislocation and the like. As a result, the following conventional countermeasures have been proposed.

These countermeasures include a method utilizing a buffer layer in which the Ge composition ratio within the SiGe is altered with a constant gentle gradient, a method utilizing a buffer layer in which the Ge (germanium) composition ratio is altered in a series of steps, a method utilizing a buffer layer in which the Ge composition ratio is altered to a supper lattice state, and a method utilizing a Si off-cut wafer and a buffer layer in which the Ge composition ratio is altered with a constant gentle gradient (U.S. Pat. Nos. 5,442,205, 5,221,413, PCT WO98/00857, and Japanese Unexamined Patent Application, First Publication No. Hei 6-252046).

However, the conventional techniques described above still suffer from the following problem.

Namely, the crystallinity of the SiGe film grown using the above conventional techniques is sufficiently poor that the threading dislocation density does not reach the level required for a device. Furthermore, it is also difficult to achieve a device of low dislocation density which also displays good surface roughness, a factor which can determine whether a device passes or fails when an actual device is manufactured. This surface roughness refers to the effect observed on the surface of irregularities generated by internal dislocation.

For example, in those cases where a buffer layer is used in which the Ge composition ratio varies with a certain gradient, the threading dislocation density can be kept comparatively low, but the surface roughness deteriorates. In contrast, in those cases where a buffer layer is used in which the Ge composition ratio varies across a series of steps, the surface roughness is comparatively low, but the threading dislocation density becomes undesirably large. Furthermore, in the case where an off-cut wafer is used, the dislocation is more likely to exit laterally, and not in the direction of the film growth, although once again a sufficiently low degree of dislocation density is unachievable.

BRIEF SUMMARY OF THE INVENTION

The present invention takes the above problems into consideration, with an object of providing a semiconductor substrate, a field effect transistor, a method of forming a SiGe layer and a method of forming a strained Si layer which utilizes this SiGe layer formation method, and a method of manufacturing a field effect transistor, in which the threading dislocation density is low and the surface roughness is minimal In order to resolve the problems detailed above, the present invention adopts the configuration described below. Namely, a semiconductor substrate of the present invention comprises a Si substrate on which is formed a SiGe buffer layer constructed of a plurality of laminated layers comprising alternating layers of a SiGe gradient composition layer in which the Ge composition ratio gradually increases from the Ge composition ratio of the base material, and a SiGe constant composition layer which is provided on top of the gradient composition layer and in which the Ge composition ratio is the same as that of the upper surface of the gradient composition layer.

Furthermore, a SiGe layer formation method according to the present invention is a method of forming a SiGe layer on top of a Si substrate, wherein a step for epitaxially growing a SiGe gradient composition layer in which the Ge composition ratio gradually increases from the Ge composition ratio of the base material, and a step for epitaxially growing, on top of the SiGe gradient composition layer, a SiGe constant composition layer in which the Ge composition ratio is the same as that of the final Ge composition ratio of the gradient composition layer, are performed repeatedly to form a plurality of layers on top of the Si substrate, and generate a SiGe layer in which the Ge composition ratio varies with a series of steps inclined relative to the direction of the film growth.

As a result of extensive research on SiGe film formation technology, the inventors discovered that dislocation within the crystal displayed the following tendencies.

Namely, it is thought that during film formation of the SiGe layer, the dislocations generated within the film display a tendency to propagate either at an oblique angle relative to the direction of the film formation, or in a lateral direction (in a direction orthogonal with the direction of the film formation: direction <110>). Furthermore, the dislocations are more likely to propagate in a lateral direction at a layer interface, although at those interfaces where the composition alters suddenly, the dislocations are more likely to propagate in the aforementioned oblique direction and nucleations of dislocation are likely to occur at higher densities.

Consequently, if film formation is carried out using a simple stepped Ge composition ratio, then it is thought that high densities of dislocations will be generated at the interface sections where a sudden variation in composition occurs, and that the dislocations will be likely to propagate at an oblique angle relative to the direction of the film formation, and that there will consequently be considerable danger of threading dislocation occurring. Furthermore, if film formation is carried out using a simple gentle Ge composition ratio gradient, then it is thought that the lack of sections (interfaces and the like) which offer opportunity for the oblique dislocations to exit in a lateral direction means that the dislocations penetrate through to the surface.

In contrast, in a method of forming a SiGe layer according to the present invention, because a step for epitaxially growing a SiGe gradient composition layer in which the Ge composition ratio gradually increases from the Ge composition ratio of the base material (Si in those cases where the base material for the growing process is a Si substrate, or SiGe in those cases where the base material is a constant composition layer), and a step for epitaxially growing a SiGe constant composition layer on top of the gradient composition layer in which the Ge composition ratio is the same as that of the final Ge composition ratio of the gradient composition layer are repeated a plurality of times, and furthermore because a semiconductor substrate of the present invention comprises a SiGe buffer layer constructed of a plurality of laminated layers comprising alternating gradient composition layers and constant composition layers, this buffer layer comprises a plurality of alternating gradient composition layers and constant composition layers with the Ge composition ratio in a series of inclined steps, and this state enables a SiGe layer to be formed for which the dislocation density is low and the surface roughness is limited.

In other words, it becomes easier for the dislocations to propagate in a lateral direction at an interface, and consequently it becomes less likely that threading dislocations will occur. Furthermore, because the composition variation at the interface is small, the nucleation of dislocations at the interface is suppressed, and dislocation will occur equally throughout the gradient composition layer, and consequently deterioration in the surface roughness can also be suppressed.

In a semiconductor substrate of the present invention, the aforementioned SiGe buffer layer should preferably comprise from 4 to 7 pairs of laminated layers, where each pair comprises one of the aforementioned gradient composition layers and one of the aforementioned constant composition layers.

Furthermore, a method of forming a SiGe layer according to the present invention, should preferably comprise from 4 to 7 repetitions of the steps for epitaxial growth of the aforementioned gradient composition layer and the aforementioned constant composition layer. In other words, if one step is considered to comprise the formation of one gradient composition layer and one constant composition layer, then as described below, increasing the number of steps decreases the threading dislocation density, and in those cases where 4 to 7 step repetitions are used to form the gradient composition layers and the constant composition layers, the threading dislocation density can be reduced to less than half the density observed after only one step.

In another semiconductor substrate of the present invention, the aforementioned SiGe buffer layer should preferably comprise 3 or 4 pairs of laminated layers, where one pair comprises one of the aforementioned gradient composition layers and one of the aforementioned constant composition layers.

Furthermore, another method of forming a SiGe layer according to the present invention, should preferably comprise 3 or 4 repetitions of the steps for epitaxial growth of the aforementioned gradient composition layer and the aforementioned constant composition layer. In other words, as described below, there is an optimum number of steps for producing the maximum reduction in the surface roughness, and in those cases where 3 to 4 step repetitions are used to form the gradient composition layers and the constant composition layers, the surface roughness can be reduced to a minimal value.

In yet another semiconductor substrate of the present invention, it is also effective if the aforementioned SiGe buffer layer is formed so that the thickness of the aforementioned gradient composition layer and the constant composition layer are set so as to gradually decrease with increasing distance from the aforementioned Si substrate.

Furthermore, in yet another method of forming a SiGe layer according to the present invention, it is also effective to gradually decrease the thickness of the gradient composition layer and the constant composition layer in the epitaxial growth steps after each step repetition. Namely, dislocation will nucleate more readily with higher Ge composition, and so if film formation is conducted with a single uniform thickness, then the uppermost layer will display greater dislocation density, whereas according to the method of the present invention, by gradually reducing the thickness of the gradient composition layer and the constant composition layer after each step repetition, a more equal distribution of dislocation can be achieved through each of the layers.

A semiconductor substrate of the present invention is a semiconductor substrate with a SiGe layer formed on top of a Si substrate, and in which the SiGe layer is formed using the SiGe layer formation method described above. In other words, because the SiGe layer in the semiconductor substrate is formed using the aforementioned method of forming a SiGe layer, a superior SiGe layer can be obtained in which the dislocation density is low and the surface roughness is minimal, and this semiconductor substrate is then ideal as a substrate for forming a strained Si layer on top of the SiGe layer.

Yet another semiconductor substrate of the present invention comprises a semiconductor substrate of the present invention described above, wherein a strained Si layer is provided either directly on the SiGe buffer layer of the semiconductor substrate, or provided on the SiGe buffer layer with another SiGe layer disposed therebetween.

Furthermore, a method of forming a strained Si layer according to the present invention is a method of forming a strained Si layer on a Si substrate with a SiGe layer disposed therebetween, comprising a step for epitaxially growing a SiGe buffer layer on a Si substrate using the SiGe layer formation method described above, and a step for epitaxially growing a strained Si layer, either directly on top of the SiGe buffer layer, or with another SiGe layer disposed therebetween.

Furthermore, yet another semiconductor substrate of the present invention is a semiconductor substrate in which a strained Si layer is formed on top of a Si substrate, with a SiGe layer disposed therebetween, wherein the strained Si layer is formed using the strained Si layer formation method of the present invention described above.

The aforementioned semiconductor substrate comprises a strained Si layer provided either directly on the SiGe buffer layer of the semiconductor substrate of the aspect of the present invention described above, or provided on the SiGe buffer layer, but with another SiGe layer disposed therebetween, and furthermore in the aforementioned method of forming a strained Si layer, a strained Si layer is epitaxially grown, either directly on top of the SiGe buffer layer generated by epitaxial growth using the aforementioned SiGe layer formation method, or with another SiGe layer disposed therebetween, and furthermore in the aforementioned semiconductor substrate, a strained Si layer is formed using the strained Si layer formation method according to the present invention, and so the Si layer is formed on the superior surface of the SiGe layer, enabling a superior quality strained Si layer to be produced. This semiconductor substrate is then ideal, for example, as a substrate for an integrated circuit using a MOSFET or the like, in which the strained Si layer is used as a channel area.

A field effect transistor of the present invention is a field effect transistor with a channel area formed on a strained Si layer which has been grown epitaxially on top of a SiGe layer, wherein the channel area is formed on the aforementioned strained Si layer of the aforementioned semiconductor substrate according to the present invention.

Furthermore, a method of manufacturing a field effect transistor according to the present invention is a method of manufacturing a field effect transistor with a channel area formed on a strained Si layer which has been grown epitaxially on top of a SiGe layer, wherein the strained Si layer is formed using the aforementioned strained Si layer formation method of the present invention.

Furthermore, a field effect transistor of the present invention is a field effect transistor with a channel area formed on a strained Si layer which has been grown epitaxially on top of a SiGe layer, wherein the strained Si layer is formed using the aforementioned strained Si layer formation method of the present invention.

In the above field effect transistors and the above method of manufacturing a field effect transistor, because the channel area is formed on the strained Si layer of the aforementioned semiconductor substrate according to the present invention, or alternatively, a strained Si layer on which the channel region is to be formed is formed using the aforementioned strained Si layer formation method of the present invention, the superior nature of the strained Si layer enables a high quality field effect transistor to be produced with a good yield.

According to the present invention, the following effects can be achieved.

According to a semiconductor substrate of the present invention, a SiGe buffer layer is provided which is constructed of a plurality of laminated layers comprising alternating gradient composition layers and constant composition layers, and according to a method of forming a SiGe layer of the present invention, a step for epitaxially growing a gradient composition layer and a step for epitaxially growing a constant composition layer are repeated a plurality of times, forming a SiGe layer in which the Ge composition ratio varies with a series of steps inclined relative to the direction of the film growth, and as a result, the occurrence of high densities of dislocations at the interfaces can be suppressed, and moreover dislocations are able to propagate in a lateral direction so as not to penetrate through to the surface.

Consequently, dislocations, which are essential for lattice relaxation, can be generated more equally throughout the substrate, enabling a reduction in surface roughness, and moreover the dislocations are able to propagate in a lateral direction, enabling film formation to be performed with a reduced occurrence of threading dislocation. As a result, a high level of crystallinity with a low threading dislocation density and a minimal surface roughness can be obtained.

According to a semiconductor substrate with a strained Si layer according to the present invention, a strained Si layer is provided either directly on the SiGe buffer layer of the aforementioned semiconductor substrate of the present invention, or alternatively provided on the SiGe buffer layer with another SiGe layer disposed therebetween, and according to a method of forming a strained Si layer of the present invention, a strained Si layer is grown epitaxially, either directly on top of the SiGe buffer layer generated by epitaxial growth using the aforementioned SiGe layer formation method of the present invention, or with another SiGe layer disposed therebetween, and as a result the Si layer can be formed on the superior surface of the SiGe layer, enabling the formation of a high quality strained Si layer.

Furthermore, according to a field effect transistor of the present invention, a channel area is formed on the aforementioned strained Si layer of the semiconductor substrate of the present invention, and according to a method of manufacturing a field effect transistor of the present invention, a strained Si layer on which the channel region is to be formed is formed using the aforementioned strained Si layer formation method of the present invention, and consequently the resulting high quality strained Si layer enables a high quality MOSFET to be produced with a good yield.

DETAILED DESCRIPTION OF THE INVENTION

As follows is a description of a first embodiment according to the present invention, with reference to FIG. 1 to FIG. 6.

Figure 1:
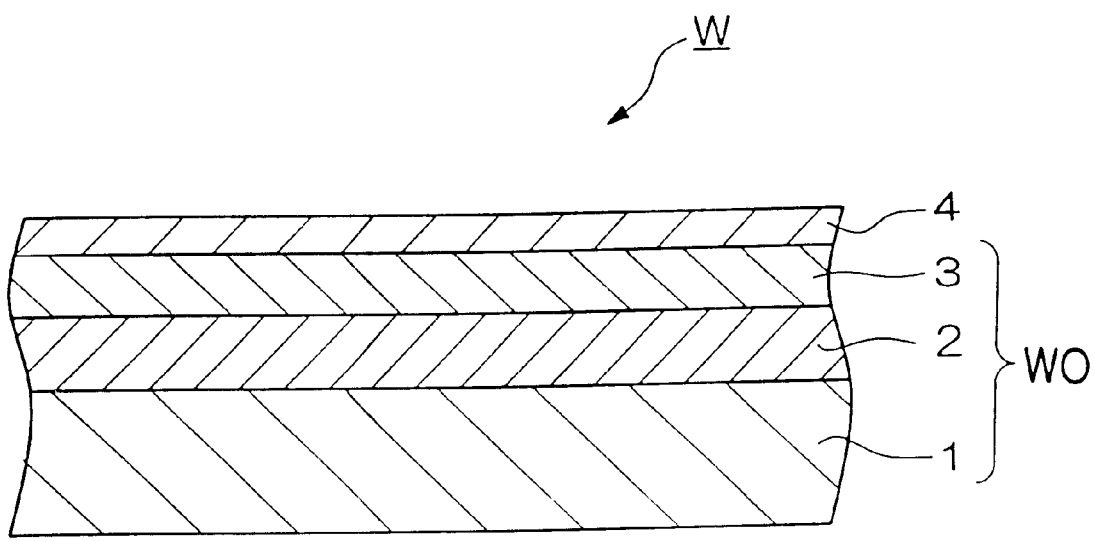
FIG. 1 is a cross-sectional diagram showing a semiconductor wafer of a first embodiment according to the present invention.

FIG. 1 shows the cross-sectional structure of a semiconductor wafer (semiconductor substrate) WO and a semiconductor wafer with a strained Si layer (semiconductor substrate) W according to the present invention, and as follows is a description of the structure of these semiconductor wafers, together with a description of the associated manufacturing process. First, as shown in FIG. 1, a $Si_{1-x}Ge_x$ stepped gradient layer (SiGe buffer layer) 2 in which the Ge composition ratio x varies from 0 to y (for example y=0.3) in a series of steps inclined relative to the direction of the film growth is grown epitaxially, using a low pressure CVD method, on the top of a Si substrate 1 which has been prepared by pulling using CZ methods. Film formation by this low pressure CVD method uses $H_2$ as a carrier gas, and $SiH_4$ and $GeH_4$ as source gases.

Next, a relaxation layer 3 with a constant Ge composition ratio of $Si_{1-y}Ge_y$ is grown epitaxially on top of the stepped gradient layer 2, thereby completing preparation of the semiconductor wafer WO. In addition, by then forming a strained Si layer 4 by epitaxially growing Si on top of a relaxation layer 3 with a Ge composition ratio z (in this first embodiment z=y) of $Si_{1-z}Ge_z$, the semiconductor wafer with a strained Si layer W of the present invention can be prepared. The film thickness of each of the layers are, for example, 1.5 $\mu$m for the stepped gradient layer 2, 0.7 to 0.8 $\mu$m for the relaxation layer 3, and 15 to 22 nm for the strained Si layer 4.

Figure 2:
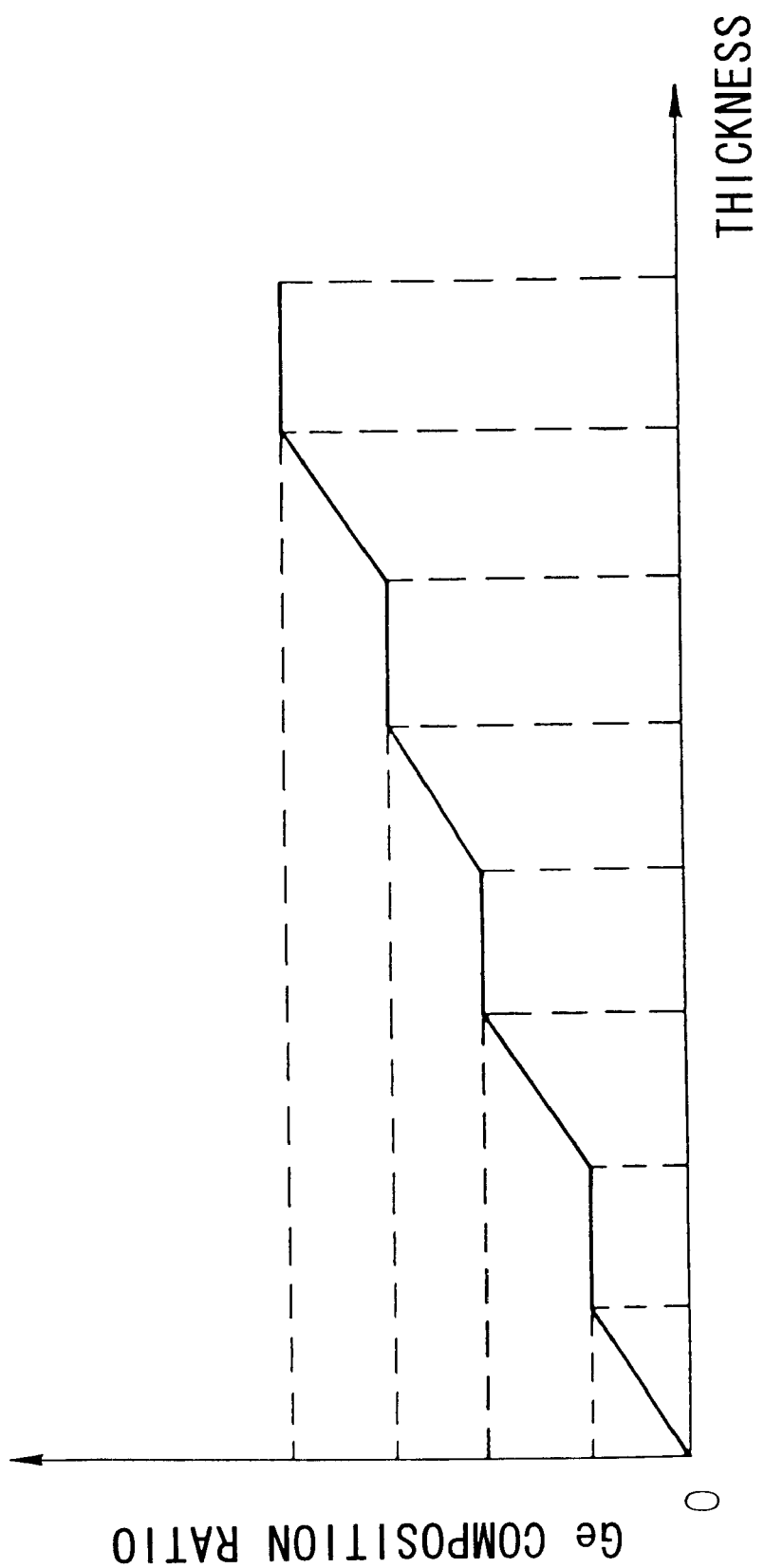
FIG. 2 is a diagram showing the Ge composition ratio relative to the film thickness of a stepped gradient layer of the first embodiment according to the present invention.
Figure 3:
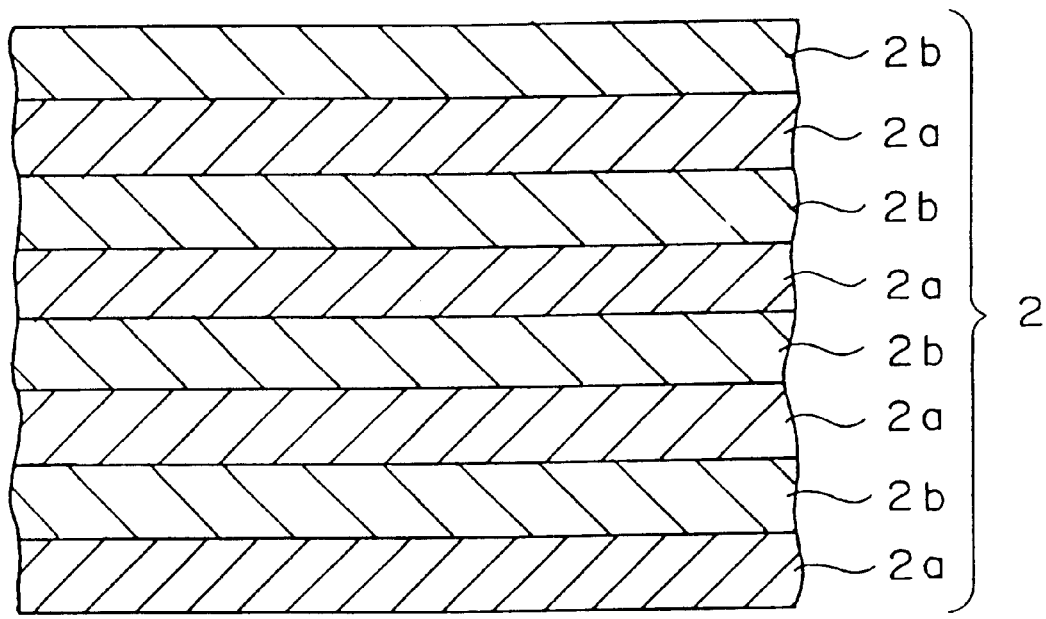
FIG. 3 is a cross-sectional diagram showing the stepped gradient layer of the first embodiment according to the present invention.

The film formation of the aforementioned stepped gradient layer 2 is carried out by repeating, a plurality of times, a step for epitaxially growing a SiGe gradient composition layer 2a in which the Ge composition ratio is gradually increased from the Ge composition ratio of the base material up to a predetermined value, and a step for epitaxially growing a SiGe constant composition layer 2b on top of the SiGe gradient composition layer 2a in which the Ge composition ratio is the same as that of the final Ge composition ratio of the gradient composition layer 2a, as shown in FIG. 2 and FIG. 3.

For example, in the present embodiment, the stepped gradient layer 2 is formed by performing four repetitions of the epitaxial growth steps for forming the gradient composition layer 2a and the constant composition layer 2b. In other words, if one step is considered to comprise the epitaxial growth of one gradient composition layer 2a and one constant composition layer 2b, then the first step will comprise growing a first gradient composition layer 2a, in which the Ge composition ratio is gradually varied from 0 to 0.075, on top of the Si substrate 1, and then forming a first constant composition layer 2b with a Ge composition ratio of 0.075 thereon. Subsequently, in a second step, a second gradient composition layer 2a, in which the Ge composition ratio is gradually varied from 0.075 to 0.15 is grown on top of the first constant composition layer 2b with a Ge composition ratio of 0.075, and a second constant composition layer 2b with a Ge composition ratio of 0.15 is then formed thereon.

Then, as a third step, a third gradient composition layer 2a, in which the Ge composition ratio is gradually varied from 0.15 to 0.225 is grown on top of the second constant composition layer 2b with a Ge composition ratio of 0.15, and a third constant composition layer 2b with a Ge composition ratio of 0.225 is then formed thereon. As a final step, a fourth gradient composition layer 2a, in which the Ge composition ratio is gradually varied from 0.225 to 0.3 is grown on top of the third constant composition layer 2b with a Ge composition ratio of 0.225, and a fourth constant composition layer 2b with a Ge composition ratio of 0.3 is then formed thereon. The film thickness of each of the gradient composition layers 2a and each of the constant composition layers 2b are set to the same value.

Figure 4:
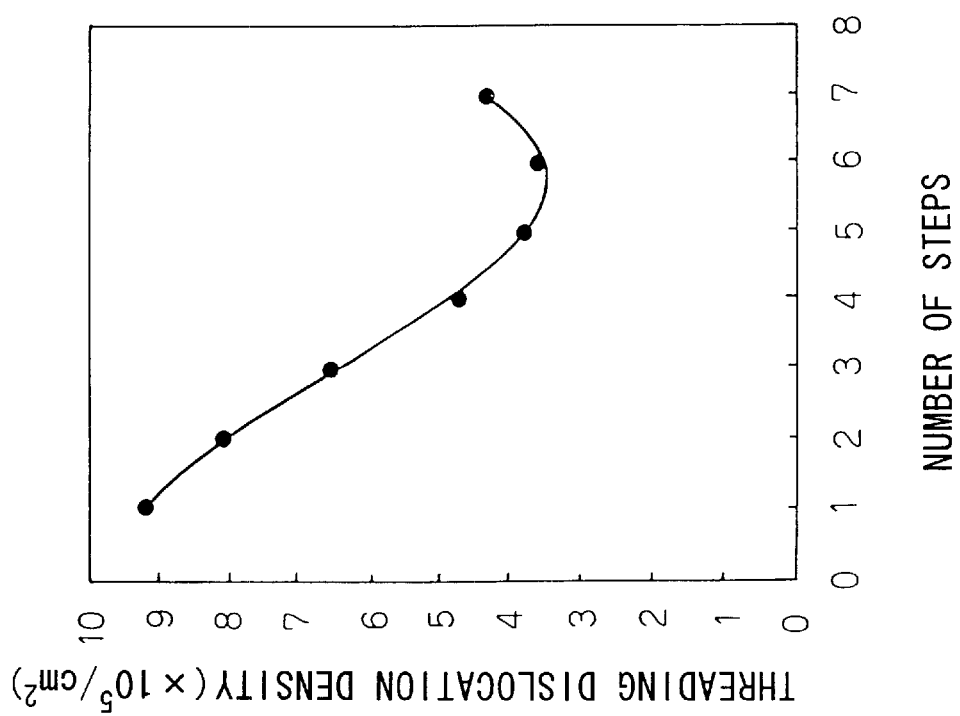
FIG. 4 is a figure showing the relationship between the number of steps and the threading dislocation density for the first embodiment according to the present invention.
Figure 5:
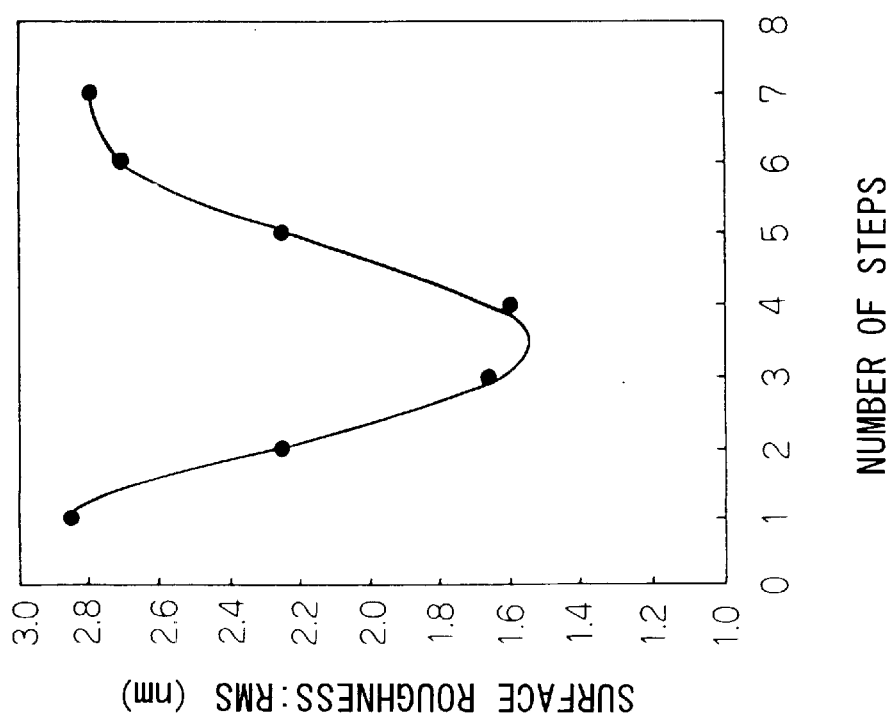
FIG. 5 is a figure showing the relationship between the number of steps and the surface roughness of the first embodiment according to the present invention.

The reason for repeating the aforementioned epitaxial growth step for the gradient composition layer 2a and the constant composition layer 2b four times (number of steps: 4) is to enable a reduction in the threading dislocation density and the surface roughness. Namely if the epitaxial growth step is repeated, then experimental results show that the relationship between the number of steps and the threading dislocation density of the formed film surface is such that the threading dislocation density after between 4 and 7 steps is less than half of that after only one step, as can be seen in FIG. 4. Furthermore, experimental results show that the relationship between the number of steps and the surface roughness is such that surface roughness is at a minimum after 3 or 4 steps, as can be seen in FIG. 5. In FIG. 5, the surface roughness is shown as an RMS (root mean square) value.

As shown in FIG. 4 and FIG. 5, performing the epitaxial growth step for the gradient composition layer 2a and the constant composition layer 2b a plurality of times generates a lower threading dislocation density and a lower degree of surface roughness than performing the step only once, but each property has a local minimum, and by setting the number of steps to 4, both the threading dislocation density and the surface roughness can be lowered effectively.

In a semiconductor wafer W comprising a semiconductor wafer WO of the present embodiment and a strained Si layer, because a step for epitaxially growing a SiGe gradient composition layer 2a in which the Ge composition ratio gradually increases from the Ge composition ratio of the base material (Si in those cases where the base for the growing process is the Si substrate 1, or SiGe in those cases where the base material is a constant composition layer 2b), and a step for epitaxially growing a SiGe constant composition layer 2b on top of the gradient composition layer 2a in which the Ge composition ratio is the same as that of the final Ge composition ratio of the gradient composition layer 2a are repeated a plurality of times, a layer is formed which comprises a plurality of alternating gradient composition layers 2a and constant composition layers 2b with the Ge composition ratio in a series of inclined steps, and as described above, this state enables the formation of a SiGe layer for which the dislocation density is low and the surface roughness is limited.

In other words, according to the present embodiment, the film formation method described above enables dislocations, which are essential for lattice relaxation, to be generated more equally throughout the substrate, and moreover enables the SiGe layer to be formed so that, as much as possible, dislocations are able to propagate in a lateral direction without penetrating through to the surface, and consequently, a good quality surface can be obtained.

As follows is a description of a field effect transistor (MOSFET) which utilizes the aforementioned semiconductor wafer W with a strained Si layer of the present invention, together with a description of the associated manufacturing process, with reference to FIG. 6.

Figure 6:
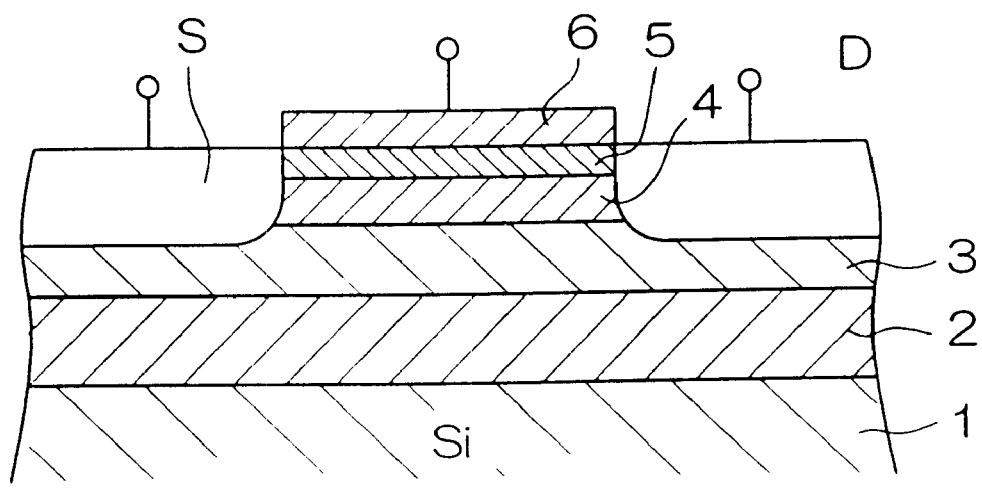
FIG. 6 is a schematic cross-sectional diagram showing a MOSFET of the first embodiment according to the present invention.

FIG. 6 is a schematic diagram showing the construction of a field effect transistor of the present invention. In order to manufacture this field effect transistor, a $SiO_2$ gate oxide film 5 and a gate polycrystalline silicon film 6 are deposited sequentially on top of the strained Si layer 4 on the surface of the semiconductor wafer W with a strained Si layer prepared by the manufacturing process described above. A gate electrode (not shown in the figure) is then formed by patterning the portion of the polycrystalline silicon film 6 above the channel area.

Subsequently, the gate oxide film 5 is also patterned and the film removed with the exception of the portion beneath the gate electrode. Ion injection is then carried out using the gate electrode as a mask, and an n-type or a p-type source area S and drain area D formed with self aligning on the strained Si layer 4 and the relaxed layer 3. A source electrode and a drain electrode (not shown in the figure) are then formed on the source area S and the drain area D respectively, thereby completing the manufacture of an n-type or a p-type MOSFET in which the strained Si layer 4 becomes the channel area.

In a MOSFET prepared in this manner, because the channel area is formed on the strained Si layer 4 of the semiconductor wafer W with a strained Si layer prepared by the manufacturing process described above, the superior quality of the strained Si layer 4 enables a high quality MOSFET to be produced with a good yield.

Figure 7:
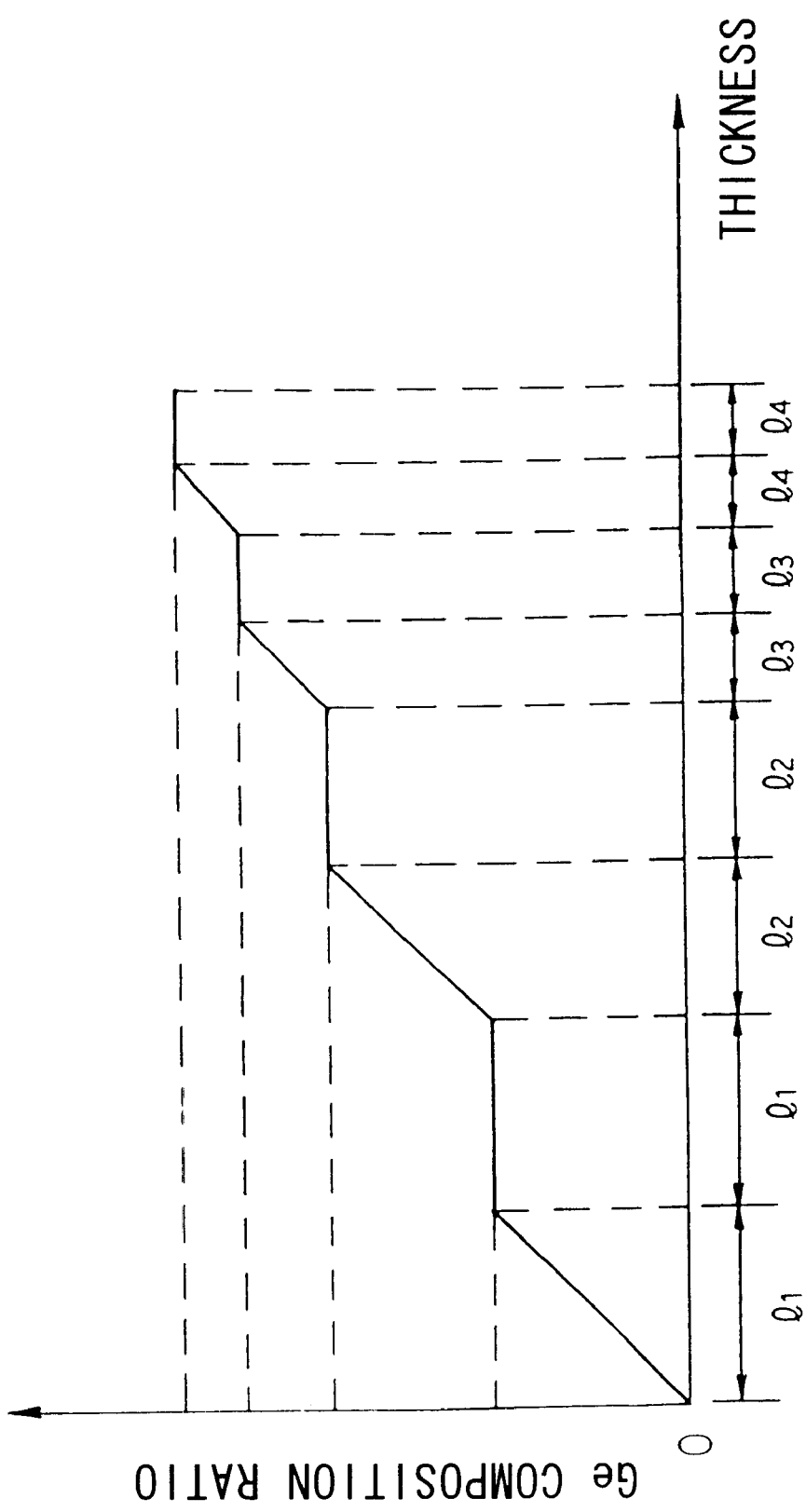
FIG. 7 is a diagram showing the Ge composition ratio relative to the film thickness of a stepped gradient layer of a second embodiment according to the present invention.
Figure 8:
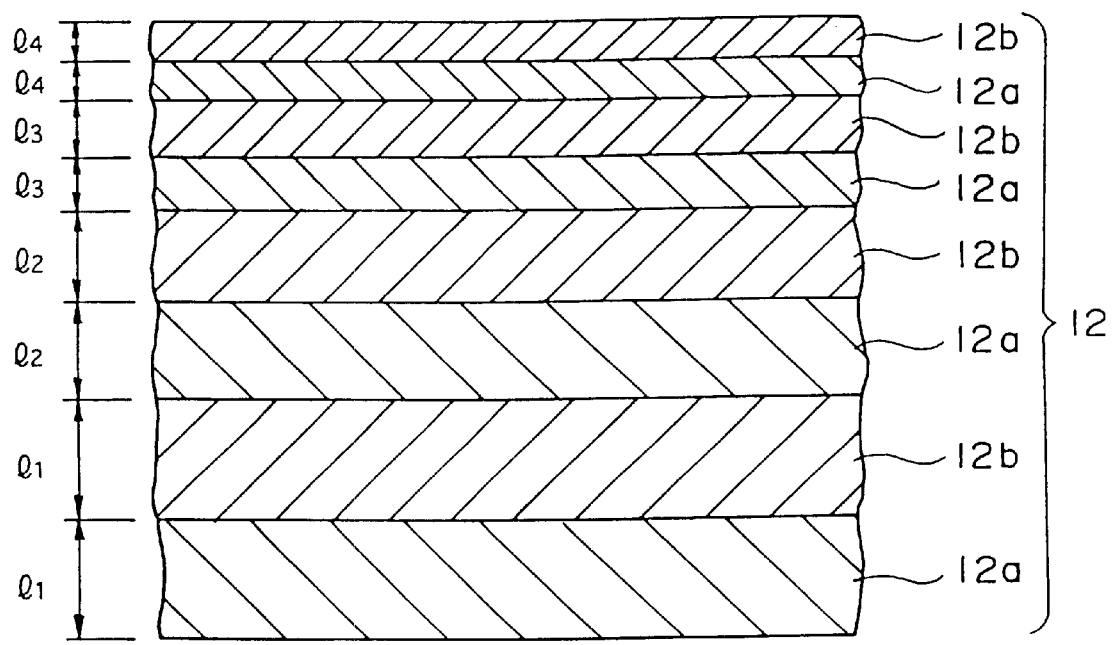
FIG. 8 is a cross-sectional diagram showing the stepped gradient layer of the second embodiment according to the present invention.

As follows is a description of a second embodiment of the present invention with reference to FIG. 7 and FIG. 8.

The point of difference between the first embodiment and the second embodiment is that whereas in the stepped gradient layer 2 of the first embodiment, the film thickness of each of the gradient composition layers 2a and the constant composition layers 2b were set to the same value, in the second embodiment, although a stepped gradient layer 12 is formed using a similar step for epitaxially growing a gradient composition layer 12a and a constant composition layer 12b, the thickness of the gradient composition layer 12a and the constant composition layer 12b is gradually reduced after each step repetition.

In other words, in this second embodiment, the epitaxial growth step for the gradient composition layer 12a and the constant composition layer 12b is used to grow a first gradient composition layer 12a and a first constant composition layer 12b, and then subsequently repeated to grow a second gradient composition layer 12a and a second constant composition layer 12b which are thinner than the first gradient composition layer 12a and the first constant composition layer 12b. Similarly, a third gradient composition layer 12a and a third constant composition layer 12b which are thinner than the second gradient composition layer 12a and the second constant composition layer 12b are grown, and finally, a fourth gradient composition layer 12a and a fourth constant composition layer 12b which are thinner than the third gradient composition layer 12a and the third constant composition layer 12b are then grown, completing the formation of the stepped gradient layer 12.

In other words, if the first gradient composition layer 12a and first constant composition layer 12b are labeled $l_1$, the second gradient composition layer 12a and second constant composition layer 12b are labeled $l_2$, the third gradient composition layer 12a and third constant composition layer 12b are labeled $l_3$, and the fourth gradient composition layer 12a and fourth constant composition layer 12b are labeled $l_4$, then the lamination of the layers is completed so that $l_1 > l_2 > l_3 > l_4$.

The critical film thickness at which dislocations start to nucleate will vary depending on the Ge composition ratio, but the thickness of the layers described above are set to a value greater than this limit, so that dislocations, which are essential for lattice relaxation, will occur equally throughout each layer.

Furthermore, the gradient of the Ge composition ratio in each of the gradient composition layers 12a is set to the same value.

As described above, dislocations are more likely to occur as the Ge composition ratio increases, so whereas in cases such as the first embodiment, where the film formation process is repeated with the same film thickness, the nucleation density of dislocation is higher within the upper layers, in cases such as the second embodiment where the thickness of the gradient composition layer 12a and the constant composition layer 12b is gradually reduced with each step repetition, the level of dislocation nucleation within each layer can be maintained at a more equal level.

The technical scope of the present invention is not limited to the embodiments described above, and it will be understood that various modifications may be made thereto within the spirit and scope of the present invention.

For example, a semiconductor substrate in which an additional SiGe layer is provided on top of the strained Si layer 4 of the semiconductor wafer W of the above embodiment, is also incorporated within the scope of the present invention.

In the above embodiments, the number of repetitions of the epitaxial growth step for forming the gradient composition layer and the constant composition layer was set at four (number of steps: 4), but a different number of steps is also possible. As described above, four is the optimal number of repetitions for effectively reducing both the threading dislocation density and the surface roughness, although setting the number of repetitions to a number from 4 to 7 enables the threading dislocation density to be reduced to less than half the value following one repetition, and setting the number of repetitions to either three or four, enables the surface roughness to be reduced to a minimum.

Furthermore, in the aforementioned embodiments, a semiconductor substrate with a SiGe layer was prepared as a MOSFET substrate, but the present invention can also be applied to substrates for other uses. For example, the method of forming a SiGe layer, and the semiconductor substrate of the present invention could also be applied to a substrate for a solar cell. Specifically, a solar cell substrate could be prepared by forming, on top of a silicon substrate from either one of the above two embodiments, a gradient composition layer of SiGe in which the Ge composition ratio is gradually increased until the uppermost surface is 100% Ge, and then depositing a film of GaAs (gallium arsenide) on top of the gradient composition layer. In so doing, a high quality solar cell substrate with a low dislocation density is able to be prepared.

As follows is a description of the results of observations of transmission electron microscopic (TEM) images for actual manufactured semiconductor substrates according to the present invention.

First, for the purposes of comparison, conventional techniques were used to prepare substrates in which (A) a SiGe layer was formed by increasing the Ge composition ratio linearly, and (B) a SiGe layer was formed by increasing the Ge composition ratio in a series of steps, and the TEM images for these comparative wafers were then viewed.

In the conventional technique (A), the TEM image revealed that dislocations were formed comparatively randomly, and the fact that almost no dislocations were observed in the uppermost layer in which the Ge composition ratio was constant, indicates that a mechanism is operating for propagating the dislocations in a lateral direction (towards the wafer edge). However, at the same time, significant numbers of dislocations propagating in the direction of the surface were also observed.

Moreover, in the conventional technique (B), the TEM image revealed that dislocations were concentrated in those areas where the composition altered. Furthermore, the results of observations of the TEM image and etch pits revealed that the density of these dislocations was extremely high. In this case, as above, it is thought that a mechanism is operating for propagating the dislocations in a lateral direction, although because the original dislocation nucleus formation density is also extremely high, there are also significant numbers of dislocations which propagate in the direction of the surface, and so the threading dislocation density is also high.

In contrast, with a semiconductor wafer of the present invention prepared by the embodiment described above, namely a wafer with a SiGe layer in which the Ge composition ratio increases in a series of inclined steps, observations revealed that dislocations occur equally within the gradient composition layer and exit in a lateral direction in a comparatively ordered manner. This is thought to be due to the fact that although a mechanism exists for propagating the dislocations in a lateral direction, as well as dislocations propagating towards the surface, the dislocations propagating towards the surface are guided towards the lateral direction by the effects of the boundaries within the composition gradient where the composition becomes constant.

In this manner, according to a semiconductor wafer prepared by a manufacturing method of the present invention, dislocations are less likely to be concentrated at interfaces than with conventional techniques, and this comparatively equal formation of dislocations can be observed in the TEM images.

What is claimed is:

1. A semiconductor substrate structure comprising a Si substrate on which is formed a SiGe buffer layer constructed of a plurality of laminated layers comprising alternating layers of a SiGe gradient composition layer in which a Ge composition ratio increases gradually from a Ge composition ratio of a base material, and a SiGe constant composition layer which is provided on top of a gradient composition layer and in which a Ge composition ratio is equal to that of an upper surface of a gradient composition layer, wherein
said SiGe buffer layer comprises from 3 to 7 pairs of laminated layers, where at least one pair comprises one of said gradient composition layer and one of said constant composition layer.

2. A semiconductor substrate according to claim 1, wherein
said SiGe buffer layer comprises from 4 to 7 pairs of laminated layers, where at least one pair comprises one of said gradient composition layer and one of said constant composition layer.

3. A semiconductor substrate structure according to claim 1, wherein
said SiGe buffer layer comprises either one of 3 and 4 pairs of laminated layers, where at least one pair comprises one of said gradient composition layer and one of said constant composition layer.

4. A semiconductor substrate structure according to claim 1, wherein
said SiGe buffer layer is formed so that thicknesses of said gradient composition layer and said constant composition layer are set so as to decrease gradually with increasing distance from said Si substrate.

5. A semiconductor substrate structure comprising a strained Si layer provided either directly on top of said SiGe buffer layer of said semiconductor substrate structure according to claim 1, or provided on said SiGe buffer layer with another SiGe layer disposed therebetween.

6. A field effect transistor comprising a channel area formed on a strained Si layer according to claim 5.

7. A method of forming a semiconductor substrate structure according to claim 1, comprising epitaxially growing on a substrate a SiGe gradient composition layer in which a Ge composition ratio increases gradually from a Ge composition ratio of a base material, and
epitaxially growing on top of said gradient composition layer a SiGe constant composition layer in which a Ge composition ratio is equal to that of a final Ge composition ratio of said gradient composition layer,
forming a plurality of layers on top of said Si substrate to generate a SiGe layer in which a Ge composition ratio varies with a series of steps inclined relative to a direction of film formation.

8. A method of forming a SiGe layer according to claim 7, wherein
said epitaxially growing said gradient composition layer and said constant composition layer are repeated from 4 to 7 times.

9. A method of forming a SiGe layer according to claim 7, wherein
said epitaxially growing said gradient composition layer and said constant composition layer are repeated either one of 3 and 4 times.

10. A method of forming a Site layer according to claim 7, wherein
a thickness of said gradient composition layer and said constant composition layer in said epitaxial growing is reduced gradually after each repetition.

11. A method of forming a strained Si layer on a Si substrate with a SiGe layer disposed therebetween, comprising
epitaxially growing a SiGe buffer layer on a Si substrate using a method of forming a SiGe layer according to claim 7, and
epitaxially growing a strained Si layer, either directly on top of said SiGe buffer layer, or with another SiGe layer disposed therebetween.

12. A method of manufacturing a field effect transistor with a channel area formed on a strained Si layer grown epitaxially on top of a SiGe layer, wherein
said strained Si layer is formed using a method of forming a strained Si layer according to claim 11.

13. A semiconductor substrate structure with a strained Si layer formed on top of a Si substrate with a SiGe layer disposed therebetween, wherein said strained Si layer is formed using a method of forming a strained Si layer according to claim 11.

14. A field effect transistor with a channel area formed on a strained Si layer grown epitaxially on top of a SiGe layer, wherein
said strained Si layer is formed using a method of forming a strained Si layer according to claim 11.

15. A semiconductor substrate structure with a SiGe layer formed on top of a Si substrate, wherein said SiGe layer is formed using a method of forming a SiGe layer according to claim 7.

* * * * *